US011182892B2

(12) United States Patent
Michelsson et al.

(10) Patent No.: US 11,182,892 B2
(45) Date of Patent: Nov. 23, 2021

(54) PERIODIC SEMICONDUCTOR DEVICE MISREGISTRATION METROLOGY SYSTEM AND METHOD

(71) Applicant: KLA CORPORATION, Milpitas, CA (US)

(72) Inventors: Detlef Michelsson, Loehnberg (DE); Yoel Feler, Haifa (IL)

(73) Assignee: KLA Corporation, Milpitas, CA (US)

( * ) Notice: Subject to any disclaimer, the term of this patent is extended or adjusted under 35 U.S.C. 154(b) by 21 days.

(21) Appl. No.: 16/605,725

(22) PCT Filed: Sep. 16, 2019

(86) PCT No.: PCT/US2019/051209
§ 371 (c)(1),
(2) Date: Oct. 16, 2019

(87) PCT Pub. No.: WO2021/054928
PCT Pub. Date: Mar. 25, 2021

(65) Prior Publication Data
US 2021/0082099 A1 Mar. 18, 2021

(51) Int. Cl.
*G06T 7/00* (2017.01)
*H01L 21/66* (2006.01)
(52) U.S. Cl.
CPC .............. *G06T 7/001* (2013.01); *H01L 22/12* (2013.01); *G06T 2207/10061* (2013.01); *G06T 2207/30148* (2013.01)
(58) Field of Classification Search
CPC ........... G06T 7/001; G06T 2207/10061; G06T 2207/30148; H01L 22/12
See application file for complete search history.

(56) References Cited

U.S. PATENT DOCUMENTS 6,486,954 B1 * 11/2002 Mieher ................ G01B 11/002
356/399
7,274,814 B2 9/2007 Ghinovker et al.
(Continued)

FOREIGN PATENT DOCUMENTS

| JP | 2014238463 A | 12/2014 |
| WO | 2017055106 A1 | 4/2017 |
| WO | 2018128641 A1 | 7/2018 |

OTHER PUBLICATIONS

WIPO, ISR for PCT/US2019/051209, dated Jun. 16, 2020.

*Primary Examiner* — Carol Wang
(74) *Attorney, Agent, or Firm* — Hodgson Russ LLP (57) ABSTRACT

A misregistration metrology system and method useful in the manufacture of semiconductor devices, the multilayered semiconductor devices including a first periodic structure having a first pitch along a first axis, the first periodic structure being formed together with a first layer of the multilayered semiconductor device, a second periodic structure having a second pitch along a second axis, the second axis not being parallel to the first axis, the second periodic structure being formed together with the first layer of the multilayered semiconductor device and a third periodic structure having a third pitch along a third axis, the third axis not being parallel to the first axis and the third axis not being parallel to the second axis, the third periodic structure being formed together with a second layer of the multilayered semiconductor device, the third periodic structure and the first and second periodic structures overlying one another, the misregistration metrology system and method including generating a single image of the first periodic structure, the second periodic structure and third periodic structure, thereby providing an aggregate signal, extracting a first component from the aggregate signal, the first component being due to the first periodic structure, extracting a second (Continued)

component from the aggregate signal, the second component being due to the second periodic structure, extracting a third component from the aggregate signal, the third component being due to the third periodic structure and analyzing the first component, the second component and the third component, thereby to ascertain misregistration between the first layer and the second layer.

20 Claims, 9 Drawing Sheets

(56) References Cited

U.S. PATENT DOCUMENTS

| | | | |
|---|---|---|---|
| 7,408,642 B1* | 8/2008 | DiBiase | G03F 9/7076 |
| | | | 356/399 |
| 7,656,528 B2* | 2/2010 | Abdulhalim | H01L 22/12 |
| | | | 356/401 |
| 9,093,458 B2 | 7/2015 | Amir et al. | |
| 9,214,317 B2 | 12/2015 | Shur | |
| 9,476,698 B2 | 10/2016 | Abdulhalim et al. | |
| 9,530,199 B1 | 12/2016 | Weinberg et al. | |
| 2004/0137341 A1 | 7/2004 | Niu et al. | |
| 2015/0115154 A1 | 4/2015 | Kim et al. | |
| 2015/0204664 A1* | 7/2015 | Bringoltz | G02B 27/4272 |
| | | | 356/492 |
| 2016/0253450 A1 | 9/2016 | Kandel et al. | |
| 2019/0122357 A1 | 4/2019 | Grunzweig et al. | |
| 2019/0163076 A1* | 5/2019 | Lee | G06T 7/001 |
| 2019/0178639 A1 | 6/2019 | Gutman et al. | |
| 2020/0249585 A1* | 8/2020 | Ghinovker | G03F 7/70683 |

* cited by examiner

PERIODIC SEMICONDUCTOR DEVICE MISREGISTRATION METROLOGY SYSTEM AND METHOD

REFERENCE TO RELATED APPLICATIONS

Reference is hereby made to the following patents and patent applications of the Applicant, which are related to the subject matter of the present application, the disclosures of which are hereby incorporated by reference:

U.S. Pat. No. 7,274,814 entitled OVERLAY MARKS, METHODS OF OVERLAY MARK DESIGN AND METHODS OF OVERLAY MEASUREMENTS;

U.S. Pat. No. 9,093,458 entitled DEVICE CORRELATED METROLOGY (DCM) FOR OVL WITH EMBEDDED SEM STRUCTURE OVERLAY TARGETS;

U.S. Pat. No. 9,214,317 entitled SYSTEM AND METHOD OF SEM OVERLAY METROLOGY;

U.S. Pat. No. 9,476,698 entitled PERIODIC PATTERNS AND TECHNIQUE TO CONTROL MISALIGNMENT BETWEEN TWO LAYERS; and U.S. Published Patent Application No. 2016/0253450 entitled METROLOGY USING OVERLAY AND YIELD CRITICAL PATTERNS.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a misregistration metrology method for measurement of misregistration in the manufacture of multilayered semiconductor devices, the multilayered semiconductor devices including a first periodic structure having a first pitch along a first axis, the first periodic structure being formed together with a first layer of the multilayered semiconductor device, a second periodic structure having a second pitch along a second axis, the second axis not being parallel to the first axis, the second periodic structure being formed together with the first layer of the multilayered semiconductor device and a third periodic structure having a third pitch along a third axis, the third axis not being parallel to the first axis and the third axis not being parallel to the second axis, the third periodic structure being formed together with a second layer of the multilayered semiconductor device, the third periodic structure and the first and second periodic structures overlying one another, the misregistration metrology method including generating a single image of the first periodic structure, the second periodic structure and third periodic structure, thereby providing an aggregate signal, extracting a first component from the aggregate signal, the first component being due to the first periodic structure, extracting a second component from the aggregate signal, the second component being due to the second periodic structure, extracting a third component from the aggregate signal, the third component being due to the third periodic structure and analyzing the first component, the second component and the third component, thereby to ascertain misregistration between the first layer and the second layer.

In accordance with a preferred embodiment of the present invention, the single image is generated using a scanning electron microscope using a field of view having a length and an area. Preferably, the aggregate signal includes contributions from all of the area.

Preferably, the extracting of the first component from the aggregate signal includes considering only a portion of the aggregate signal that lies along the first axis. Preferably, the extracting of the second component from the aggregate signal includes considering only a portion of the aggregate signal that lies along the second axis. Preferably, the extracting of the third component from the aggregate signal includes considering only a portion of the aggregate signal that lies along the third axis.

In accordance with a preferred embodiment of the present invention the method also includes generating clean first periodic structure data, generating clean second periodic structure data and generating clean third periodic structure data.

In accordance with a preferred embodiment of the present invention, the clean first periodic structure data is a function of the first component and the first pitch. Alternatively, in accordance with a preferred embodiment of the present invention, the clean first periodic structure data is a function of the first component, the first pitch and harmonics of the first pitch.

In accordance with a preferred embodiment of the present invention, the clean second periodic structure data is a function of the second component and the second pitch. Alternatively, in accordance with a preferred embodiment of the present invention, the clean second periodic structure data is a function of the second component, the second pitch and harmonics of the second pitch.

In accordance with a preferred embodiment of the present invention, the clean third periodic structure data is a function of the third component and the third pitch. Alternatively, in accordance with a preferred embodiment of the present invention, the clean third periodic structure data is a function of the third component, the third pitch and harmonics of the third pitch.

Preferably, the analyzing the first component, the second component and the third component, thereby to ascertain misregistration between the first layer and the second layer includes identifying a first reference location whereat at least one of maxima and minima of the clean first periodic structure data and the clean second periodic structure data intersect, identifying a second reference location whereat at least one of maxima and minima of the clean third periodic structure data most closely intersects the first reference location and calculating a difference between the first reference location and the second reference location, thereby to ascertain misregistration between the first layer and the second layer.

In accordance with a preferred embodiment of the present invention, the second layer also includes a fourth periodic structure having a fourth pitch along a fourth axis, the fourth axis not being parallel to the first axis, the second axis or the third axis, a fourth component, being due to the fourth periodic structure, is extracted from the aggregate signal, clean fourth periodic structure data is generated from the fourth component and the ascertaining of misregistration between the first layer and the second layer includes identifying a first reference location whereat at least one of maxima and minima of the clean first periodic structure data and the clean second periodic structure data intersect, identifying a second reference location, which most closely intersects the first reference location, whereat at least one of maxima and minima of the clean third periodic structure data and the clean fourth periodic structure data intersect and calculating a difference between the first reference location and the second reference location, thereby to ascertain misregistration between the first layer and the second layer.

In accordance with a preferred embodiment of the present invention, the first pitch, the second pitch and the third pitch are each between 1/1000-1/4 of the length of the field of view of the wafer imaging tool. Alternatively, in accordance with a preferred embodiment of the present invention, the first pitch, the second pitch and the third pitch are each between 1/500-1/20 of the length of the field of view of the wafer imaging tool.

In accordance with a preferred embodiment of the present invention, the multilayered semiconductor device also includes at least a third layer formed together with at least a third-layer periodic structure having a third-layer pitch along a third-layer axis, the third-layer axis not being parallel to the first axis, the third-layer axis not being parallel to the second axis and the third-layer axis not being parallel to the third axis and wherein the method includes generating a single image of the third-layer periodic structure and the first and second periodic structures, thereby providing an aggregate signal, extracting a third-layer component from the aggregate signal, the third-layer component being due to the third-layer periodic structure and analyzing the third-layer component, the first component and the second component, thereby to ascertain misregistration between the third layer and the first layer.

There is also provided in accordance with another preferred embodiment of the present invention a misregistration metrology system for measurement of misregistration in the manufacture of multilayered semiconductor devices, the multilayered semiconductor devices including a first periodic structure having a first pitch along a first axis, the first periodic structure being formed together with a first layer of the multilayered semiconductor device, a second periodic structure having a second pitch along a second axis, the second axis not being parallel to the first axis, the second periodic structure being formed together with the first layer of the multilayered semiconductor device and a third periodic structure having a third pitch along a third axis, the third axis not being parallel to the first axis and the third axis not being parallel to the second axis, the third periodic structure being formed together with a second layer of the multilayered semiconductor device, the third periodic structure and the first and second periodic structures overlying one another, the misregistration metrology system including a wafer imaging tool operative to generate a single image of the first periodic structure, the second periodic structure and the third periodic structure, thereby providing an aggregate signal and a misregistration analyzer operative to extract a first component from the aggregate signal, the first component being due to the first periodic structure, extract a second component from the aggregate signal, the second component being due to the second periodic structure, extract a third component from the aggregate signal, the third component being due to the at third periodic structure and analyze the first component, the second component and the third component, thereby to ascertain misregistration between the first layer and the second layer.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

It is appreciated that the system and method described hereinbelow with reference to FIGS. 1-6B form part of a manufacturing process for semiconductor devices, and the misregistration measured by the system and method described hereinbelow with reference to FIGS. 1-6B is used to adjust fabrication processes of the semiconductor devices to more closely align various layers of the semiconductor devices being fabricated.

Figure 1:
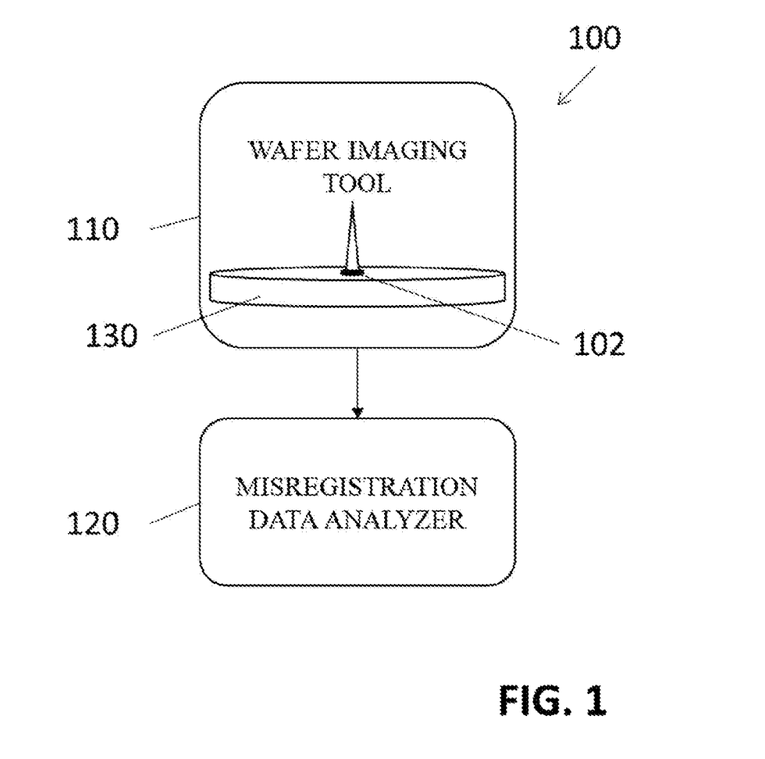
FIG. 1 is a simplified schematic illustration of a periodic semiconductor device misregistration metrology system (PSDMMS)
Figure 2A:
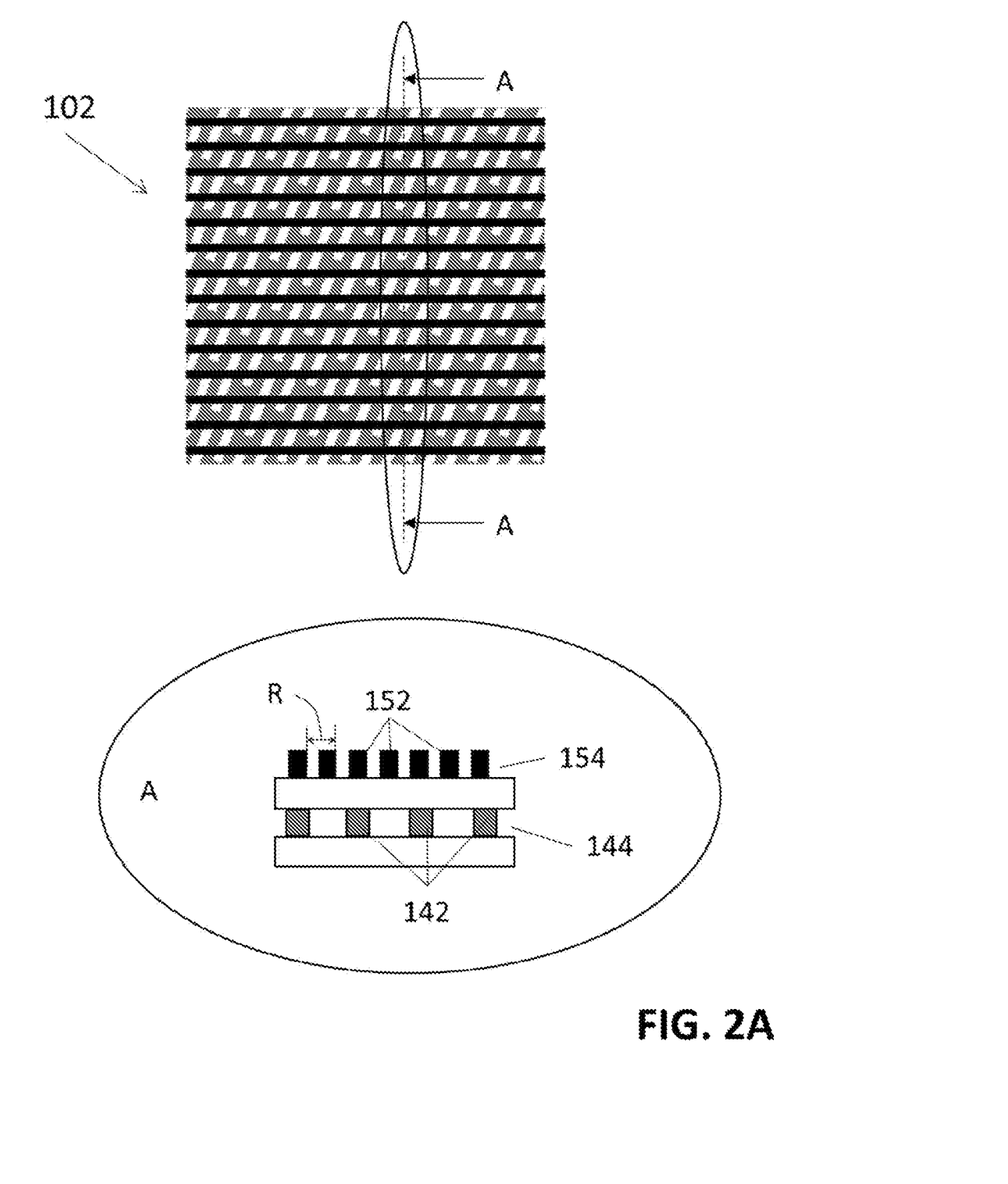
FIGS. 2A, 2B and 2C are simplified pictorial illustrations of an embodiment of a multilayered semiconductor device fabricated using a fabrication system including the PSDMMS of FIG. 1.
Figure 2B:
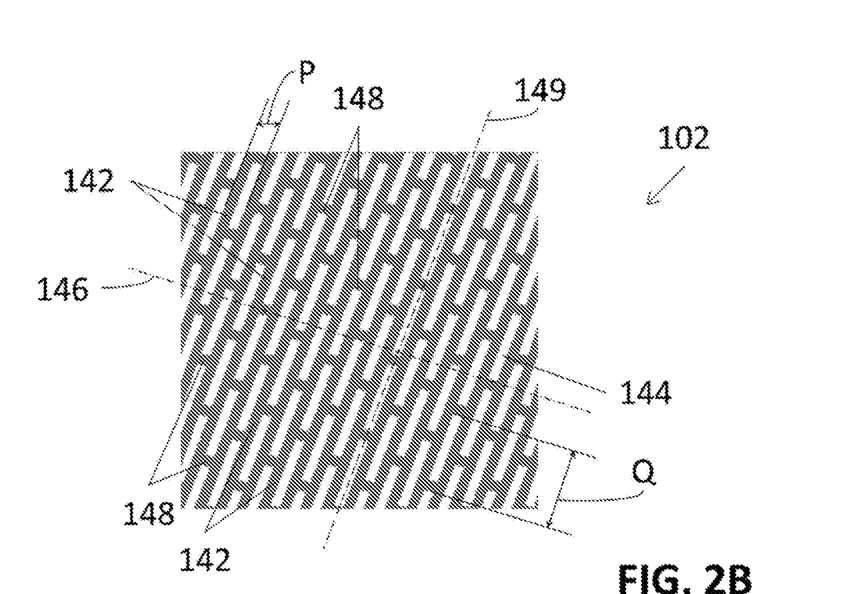
Figure 2C:
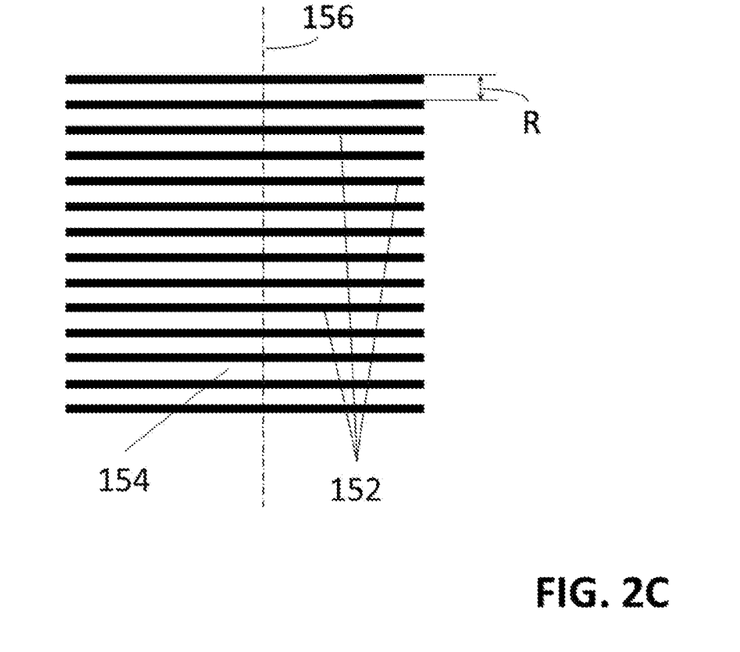

Reference is now made to FIG. 1, which is a simplified schematic illustration of a periodic semiconductor device misregistration metrology system (PSDMMS) 100, and to FIGS. 2A-2C, which are simplified pictorial illustrations of an embodiment of a multilayered semiconductor device 102 fabricated using a fabrication system including PSDMMS 100.

As seen in FIG. 1, PSDMMS 100 includes a wafer imaging tool 110 and a misregistration data analyzer 120. In a preferred embodiment of the present invention, wafer imaging tool 110 is a scanning electron microscope. A typical scanning electron microscope useful as wafer imaging tool 110 is an eDR7380™, commercially available from the KLA Corporation of Milpitas, Calif., USA. As described hereinbelow with reference to FIGS. 4A-6B, together with misregistration data analyzer 120, wafer imaging tool 110 is operative to measure misregistration between layers formed on a wafer 130, the layers being part of at least one multilayered semiconductor device 102 formed thereon. Wafer imaging tool 110 is characterized by a field of view (FOV), which has a characteristic length, typically between 0.1 μm-20 μm, and more preferably between 0.25 μm-10 μm.

As seen particularly in FIGS. 2A-2C, multilayered semiconductor device 102 includes at least a first periodic structure 142 formed with a first layer 144 and characterized by a first pitch P along a first axis 146. In the embodiment of the present invention illustrated in FIGS. 2A & 2B, first layer 144 also includes a second periodic structure 148 characterized by a second pitch Q along a second axis 149. It is a particular feature of the present invention that first axis 146 and second axis 149 are not parallel to one another. Multilayered semiconductor device 102 further includes at least a third periodic structure 152 formed with a second layer 154 and characterized by a third pitch R along a third axis 156. It is a particular feature of the present invention that third axis 156 is not parallel to either first axis 146 or second axis 149. Third periodic structure 152 at least partially overlies or underlies first and second periodic structures 142 and 148. It is appreciated that although FIG. 2A shows third periodic structure 152 overlying first periodic structure 142 and second periodic structure 148, in an alternate embodiment, first periodic structure 142 and second periodic structure 148 may overly third periodic structure 152. First and second layers 144 and 154 may be adjacent layers, but need not be.

As noted above, it is a particular feature of the present invention that none of first axis 146, second axis 149 and third axis 156 are parallel to one another. Additionally, one or both of first and second layers 144 and 154 may include additional periodic features (not shown) having a pitch along yet another axis (not shown).

In a preferred embodiment of the present invention, pitches P, Q and R are all different from one another. In an alternative embodiment of the present invention, any or all of pitches P, Q and R may have the same value. Preferably, each of first periodic structure 142, second periodic structure 148 and third periodic structure 152 has an area at least as large as the FOV of wafer imaging tool 110. Preferably, each of pitches P, Q and R are between 1/1000-1/4 of the length of the FOV of wafer imaging tool 110. More preferably, each of pitches P, Q and R are between 1/500-1/20 of the length of the FOV of wafer imaging tool 110. Thus, each of pitches P, Q and R are preferably between 1 nm-2500 nm, and more preferably between 2 nm-500 nm.

Figure 3A:
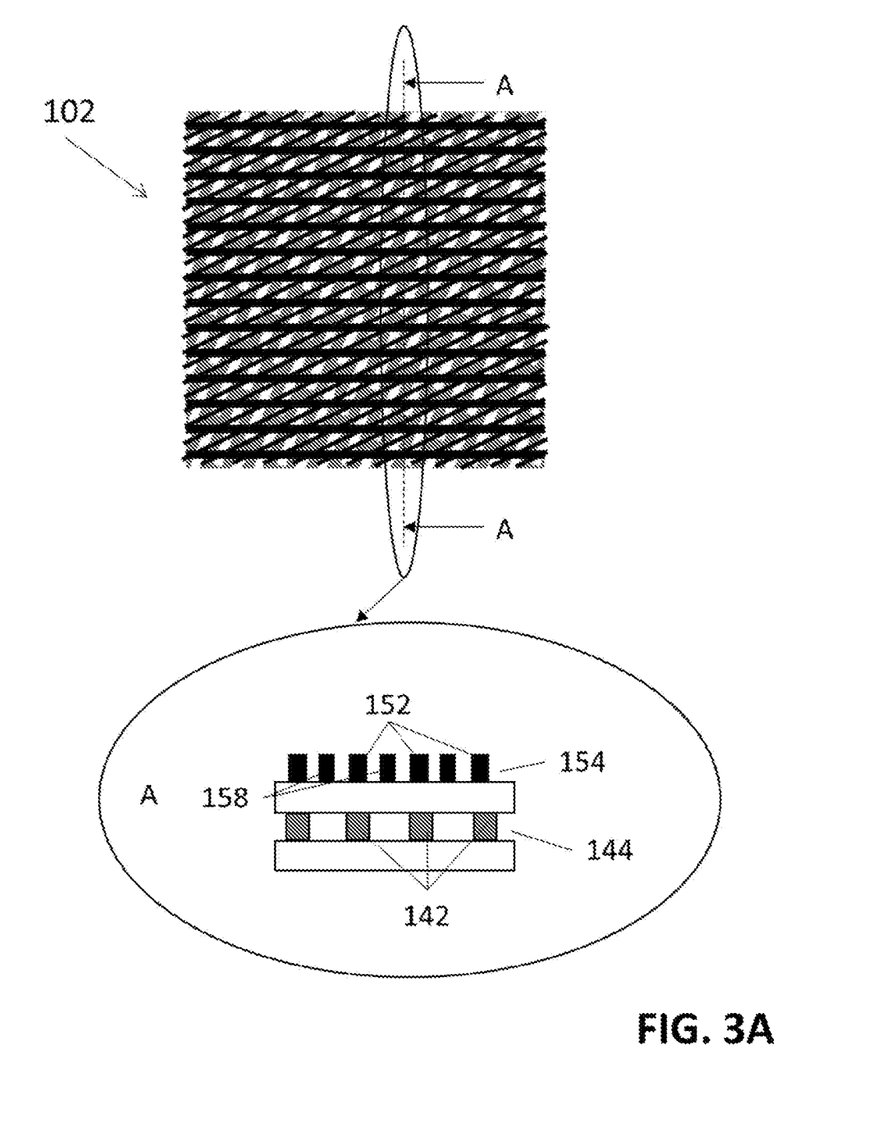
FIGS. 3A, 3B and 3C are simplified pictorial illustrations of another embodiment of a multilayered semiconductor device fabricated using a fabrication system including the PSDMMS of FIG. 1.
Figure 3B:
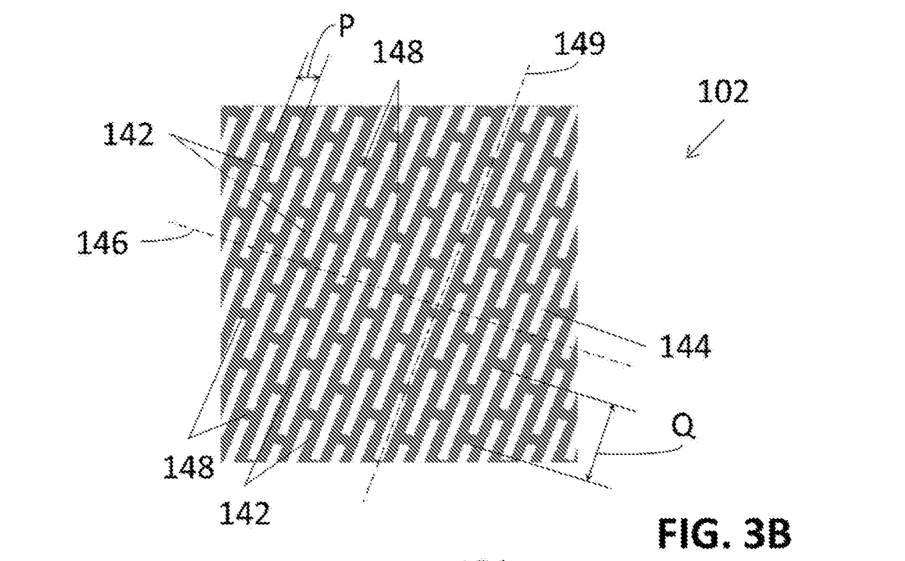
Figure 3C:
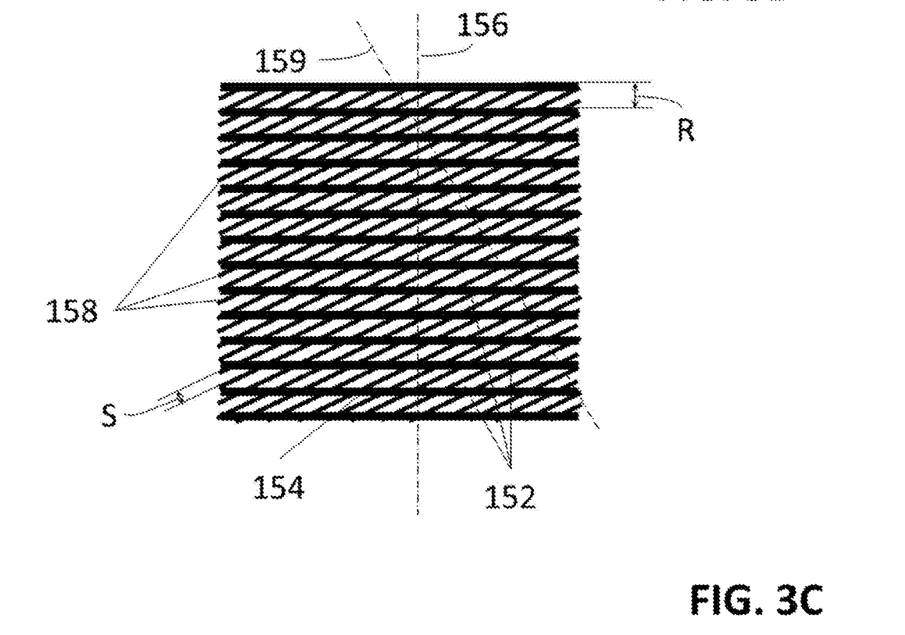

As seen in FIGS. 3A-3C, in another preferred embodiment of the present invention, multilayered semiconductor device 102 includes at least first periodic structure 142 formed with first layer 144 and characterized by first pitch P along first axis 146. In the embodiment of the present invention illustrated in FIGS. 3A & 3B, first layer 144 also includes second periodic structure 148 characterized by a pitch Q along second axis 149. It is a particular feature of the present invention that first axis 146 and second axis 149 are not parallel to one another.

In the embodiment shown in FIGS. 3A-3C, multilayered semiconductor device 102 further includes at least third periodic structure 152 formed with second layer 154 and characterized by third pitch R along third axis 156. In the embodiment of the present invention illustrated in FIGS. 3A & 3C, second layer 154 also includes a fourth periodic structure 158 characterized by a pitch S along a fourth axis 159. It is a particular feature of the present invention that none of axes 146, 149, 156 and 159 are parallel to one another. Third periodic structure 152 and fourth periodic structure 158 at least partially overlie or underlie first and second periodic structures 142 and 148. It is appreciated that although FIG. 3A shows third periodic structure 152 and fourth periodic structure 158 overlying first periodic structure 142 and second periodic structure 148, in an alternate embodiment, first periodic structure 142 and second periodic structure 148 may overly third periodic structure 152 and fourth periodic structure 158. First and second layers 144 and 154 may be adjacent layers, but need not be.

As noted above, it is a particular feature of the present invention that none of first axis 146, second axis 149, third axis 156 and fourth axis 159 are parallel to one another. Additionally, one or both of first and second layers 144 and 154 may include additional periodic features (not shown) having a pitch along yet another axis (not shown).

In a preferred embodiment of the present invention, pitches P, Q, R and S are all different from one another. In an alternative embodiment of the present invention, any or all of pitches P, Q, R and S may have the same value. Preferably, each of first periodic structure 142, second periodic structure 148, third periodic structure 152 and fourth periodic structure 158 has an area at least as large as the FOV of wafer imaging tool 110. Preferably, each of pitches P, Q, R and S are between 1/1000-1/4 of the length of the FOV of wafer imaging tool 110. More preferably, each of pitches P, Q, R and S are between 1/500-1/20 of the length of the FOV of wafer imaging tool 110. Thus, each of pitches P, Q, R and S are preferably between 1 nm-2500 nm, and more preferably between 2 nm-500 nm.

It is appreciated that multilayered semiconductor device 102 as described hereinabove with reference to FIGS. 1-3C may also include three or more layers between which misregistration may be measured using the method described hereinbelow with reference to FIGS. 4A-6B. In a case wherein multilayered semiconductor device 102 includes three or more layers for misregistration measurement, each layer for misregistration measurement includes at least one periodic structure, and at least one of the layers for misregistration measurement includes at least two periodic structures. Each of the periodic structures is formed together with a corresponding layer of the semiconductor device wafer whose misregistration is to be measured, and is characterized by a pitch along an axis. In a preferred embodiment of the present invention, the axes of any two periodic structures formed with layers between which misregistration is to be measured are not parallel axes. It is noted that each of the periodic structures preferably has an area at least as large as the FOV of wafer imaging tool 110. It is further noted that each of the periodic structures preferably has at least one pitch being between 1/1000-1/4 of the length of the FOV of wafer imaging tool 110 and more preferably between 1/500-1/20 of the length of the FOV of wafer imaging tool 110. Thus, each of the periodic structures preferably has at least one pitch between 1 nm-2500 nm, and more preferably between 2 nm-500 nm. It is appreciated that the misregistration of any two layers of such a multilayered semiconductor device 102 can be measured by system 100 by comparing the misregistration of the periodic structures on those two layers, as described hereinbelow with reference to FIGS. 4A-6B.

Figure 4A:
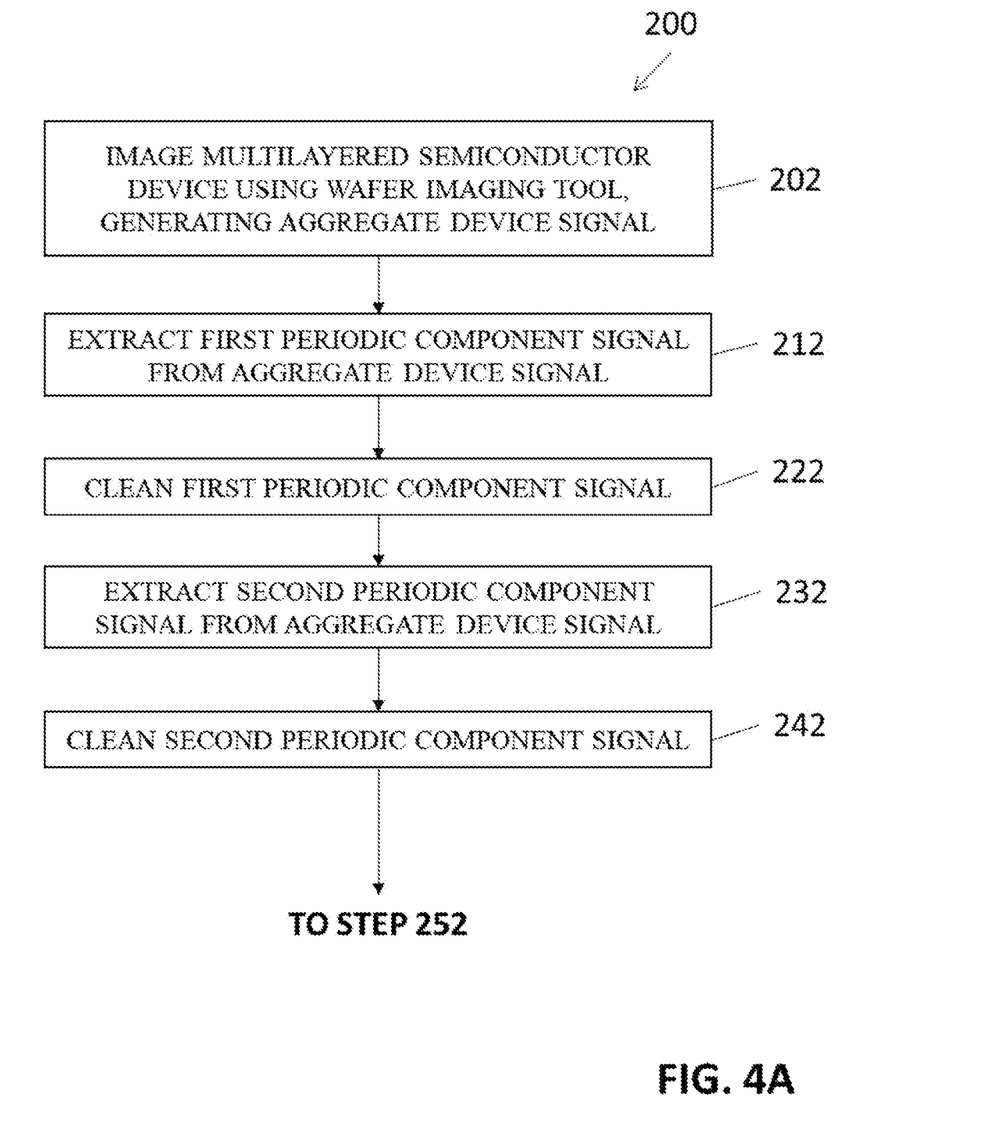
FIGS. 4A & 4B are together a simplified flow chart illustrating a periodic semiconductor device misregistration metrology method (PSDMMM) useful in conjunction with the PSDMMS of FIG. 1.
Figure 4B:
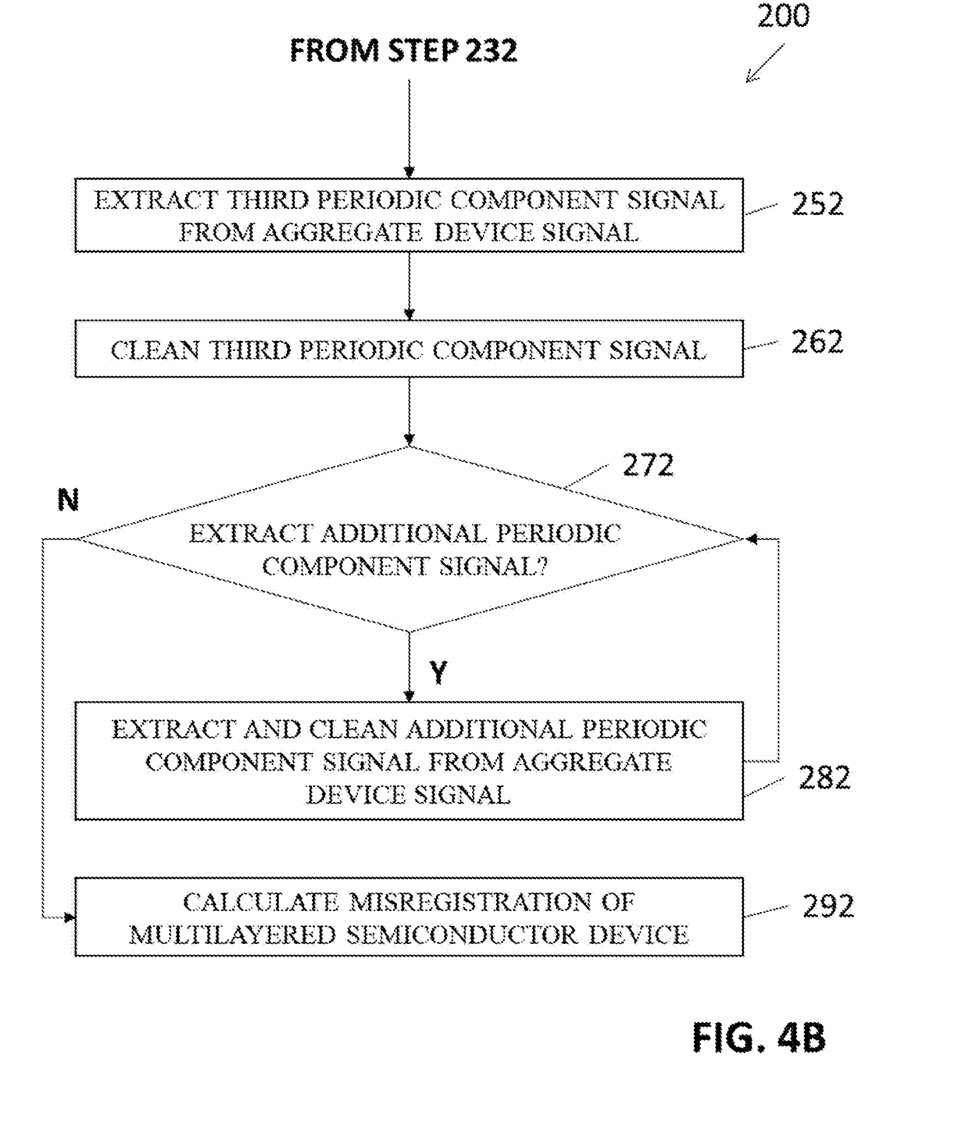
Figure 5:
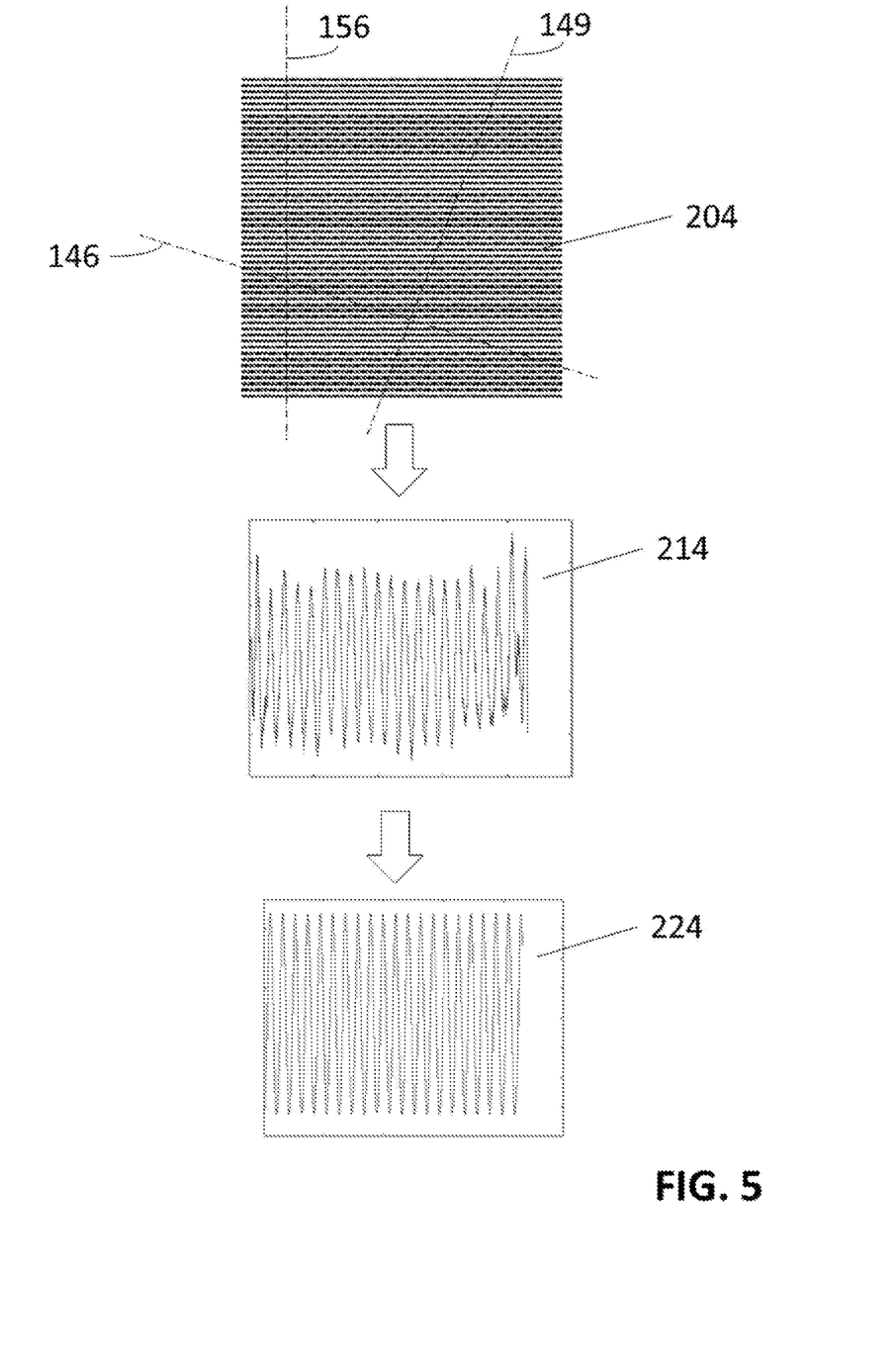
FIG. 5 is a simplified pictorial illustration, useful in understanding a portion of the PSDMMM of FIGS. 4A & 4B.

Reference is now made to FIGS. 4A & 4B, which are together a simplified flow chart illustrating a periodic semiconductor device misregistration metrology method (PSDMMM) 200 useful by PSDMMS 100, and to FIG. 5, which is a simplified pictorial illustration of a portion of PSDMMM 200.

As seen in FIG. 4A, at a first step 202, a wafer, including at least one multilayered semiconductor device 102 formed thereon, is provided. Wafer imaging tool 110 images the wafer, generating a single image, thereby providing aggregate signal 204. Aggregate signal 204 includes components being due to each of first periodic structure 142, second periodic structure 148 and third periodic structure 152. It is appreciated that aggregate signal 204 illustrated in FIG. 4 shows a simplified representation of gray level vs. position for an image of semiconductor device 102 taken with wafer imaging tool 110. In a preferred embodiment of the present invention, aggregate signal 204 includes contributions from all of the area of the FOV of wafer imaging tool 110.

As seen in FIGS. 4A & 5, at a next step 212, misregistration data analyzer 120 extracts raw data 214 due to first periodic structure 142 from aggregate signal 204 generated at step 202. It is appreciated that raw data 214 is extracted from aggregate signal 204 by considering only the component of aggregate signal 204 that lies along axis 146.

At a next step 222, misregistration data analyzer 120 cleans raw data 214, generating clean first periodic structure data 224. Clean first periodic structure data 224 preferably includes a linear combination of a set of periodic functions, such as sinusoidal functions, preferably one periodic function for each harmonic considered, along with an offset. The periodic function for each harmonic includes information relating to pitch P, as well as a weighting factor and a phase shift. The offset, weighting factor and phase shift are preferably fitted to raw data 214 using a least square error minimization method.

In a preferred embodiment of the present invention, clean first periodic structure data 224 is represented by equation 1:

$$f_1(x) = c_1 + \sum_{k=1}^{n_1} a_{1,k} \sin\left(k\frac{2\pi}{P_1}x + \varphi_{1,k}\right) \quad \text{(Eq. 1)}$$

where $f_1(x)$ is clean first periodic structure data 224, $c_1$ is the offset, k is an index indicating a harmonic considered, $n_1$ is the total number of harmonics considered, $a_{1,k}$ is the weighting factor, $P_1$ is pitch P, x is the linear position in the profile and $\varphi_{1,k}$ is the phase shift.

Since pitch P along axis 146 of first periodic structure 142 is known, misregistration data analyzer 120 generates clean first periodic structure data 224 by removing components from raw data 214 that don't correspond to the periodicity of pitch P or pitch P and at least one of its upper harmonics. Such components may be due to, for example, other features of multilayered semiconductor device 102 that lie either fully or partially along axis 146.

At a next step 232, misregistration data analyzer 120 extracts raw data due to second periodic structure 148 from aggregate signal 204 generated at step 202. It is appreciated that the raw data due to second periodic structure 148 is extracted from aggregate signal 204 by considering only the component of aggregate signal 204 that lies along axis 149.

At a next step 242, misregistration data analyzer 120 cleans the raw data due to second periodic structure 148, generating clean second periodic structure data. Clean second periodic structure data preferably includes a linear combination of a set of periodic functions, such as sinusoidal functions, preferably one periodic function for each harmonic considered, along with an offset. The periodic function for each harmonic includes information relating to pitch Q, as well as a weighting factor and a phase shift. The offset, weighting factor and phase shift are preferably fitted to raw data due to second periodic structure 148 using a least square error minimization method.

In a preferred embodiment of the present invention, the clean second periodic structure data is represented by equation 2:

$$f_2(x) = c_2 + \sum_{k=1}^{n_2} a_{2,k} \sin\left(k\frac{2\pi}{P_2}x + \varphi_{2,k}\right) \quad \text{(Eq. 2)}$$

where $f_2(x)$ is the clean second periodic structure data, $c_2$ is the offset, k is an index indicating a harmonic considered, $n_2$ is the total number of harmonics considered, $a_{2,k}$ is the weighting factor, $P_2$ is pitch Q of second periodic structure 148, x is the linear position in the profile and $\varphi_{2,k}$ is the phase shift.

Since pitch Q along axis 149 of second periodic structure 148 is known, misregistration data analyzer 120 generates the clean second periodic structure data by removing components from the raw data due to second periodic structure that don't correspond to the periodicity of pitch Q or pitch Q and at least one of its upper harmonics. Such components may be due to, for example, other features of multilayered semiconductor device 102 that lie either fully or partially along axis 149.

At a next step 252, misregistration data analyzer 120 extracts raw data due to third periodic structure 152 from aggregate signal 204 generated at step 202. It is appreciated that the raw data due to third periodic structure 152 is extracted from aggregate signal 204 by considering only the component of aggregate signal 204 that lies along axis 156.

At a next step 262, misregistration data analyzer 120 cleans the raw data generated at step 252, generating clean third periodic structure data corresponding to the raw data generated at step 252. The clean second periodic structure data corresponding to the raw data generated at step 252 preferably includes a linear combination of a set of periodic functions, such as sinusoidal functions, preferably one periodic function for each harmonic considered, along with an offset. The periodic function for each harmonic includes information relating to pitch R, as well as a weighting factor and a phase shift. The offset, weighting factor and phase shift are preferably fitted to the raw data generated at step 252 using a least square error minimization method.

In a preferred embodiment of the present invention, the clean third periodic structure data corresponding to the raw data generated at step 252 is represented by equation 3:

$$f_3(x) = c_3 + \sum_{k=1}^{n_3} a_{3,k} \sin\left(k\frac{2\pi}{P_3}x + \varphi_{3,k}\right) \quad \text{(Eq. 3)}$$

where $f_3(x)$ is the clean third periodic structure data corresponding to the raw data generated at step 252, $c_3$ is the offset, k is an index indicating a harmonic considered, $n_3$ is the total number of harmonics considered, $a_{3,k}$ is the weighting factor, $P_3$ is pitch R, x is the linear position in the profile and $\varphi_{3,k}$ is the phase shift.

Since pitch R along axis 156 of third periodic structure 152 is known, misregistration data analyzer 120 generates the clean second periodic structure data corresponding to the raw data generated at step 252 by removing components from the raw data generated at step 252 that don't correspond to the periodicity of pitch R or pitch R and at least one of its upper harmonics. Such components may be due to, for example, other features of multilayered semiconductor device 102 that lie either fully or partially along axis 156.

At a next step 272, a determination is made whether or not to extract additional data due to one or more additional periodic structures formed with either layer 144 or 154 from aggregate signal 204 generated at step 202. If additional data due to one or more additional periodic structures formed with either layer 144 or 154 is to be extracted, at a next step 282, misregistration data analyzer 120 proceeds to extract additional raw data from aggregate signal 204 by considering only the component of aggregate signal 204 that lies along an axis along which the currently considered additional periodic structure exhibits periodicity.

Also at step 282, misregistration data analyzer 120 cleans the additional raw data extracted at step 282, generating additional clean periodic structure data. The additional clean periodic structure data preferably includes a linear combination of a set of periodic functions, such as sinusoidal functions, preferably one periodic function for each harmonic considered, along with an offset. The periodic function for each harmonic includes information relating to the pitch of the currently considered additional periodic structure, as well as a weighting factor and a phase shift. The offset, weighting factor and phase shift are preferably fitted to the additional raw data generated at step 282 using a least square error minimization method.

In a preferred embodiment of the present invention, the additional clean periodic structure data is represented by equation 4:

$$f_4(x) = c_4 + \sum_{k=1}^{n_4} a_{4,k} \sin\left(k\frac{2\pi}{P_4}x + \varphi_{4,k}\right) \quad \text{(Eq. 4)}$$

where $f_4(x)$ is the additional clean periodic structure data, $c_4$ is the offset, k is an index indicating a harmonic considered, $n_4$ is the total number of harmonics considered, $a_{4,k}$ is the weighting factor, $P_4$ is the pitch of the currently considered additional periodic structure, x is the linear position in the profile and $\varphi_{4,k}$ is the phase shift.

Since pitch $P_4$ of the currently considered additional periodic structure is known, misregistration data analyzer 120 generates the additional clean second periodic structure data by removing components from the additional raw data generated at step 282 that don't correspond to the periodicity of the pitch of the currently considered additional periodic structure or the pitch of the currently considered additional periodic structure and at least one of its upper harmonics. Such components may be due to, for example, other features of multilayered semiconductor device 102 that lie either fully or partially along the axis along which the currently considered additional periodic structure exhibits periodicity.

Following step 282, PSDMMM 200 returns to step 272 and determines whether or not to extract additional data due to another periodic structure formed together with either layer 144 or 154 from aggregate signal 204 generated at step 202. If additional data due to another periodic structure is not to be extracted, at a next step 292, misregistration between layers 144 and 154 of multilayered semiconductor device 102 is calculated, as described hereinbelow with reference to FIGS. 6A & 6B.

Figure 6A:
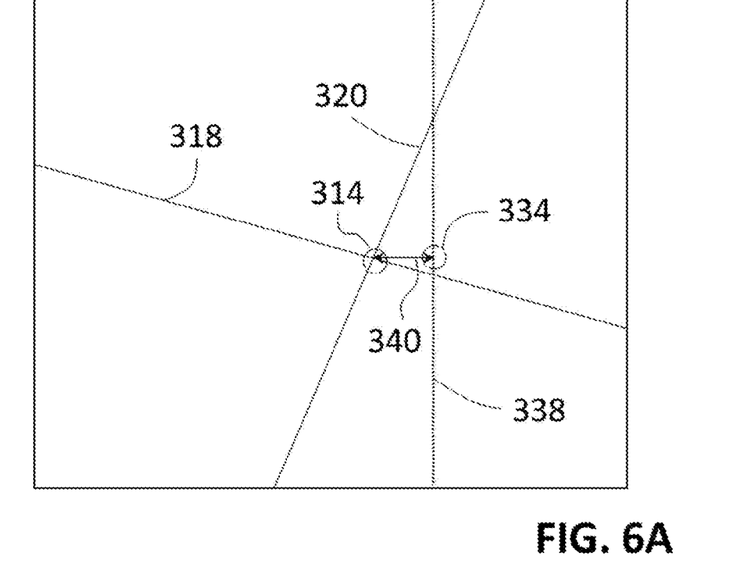
FIGS. 6A and 6B are simplified pictorial illustrations, useful in understanding two embodiments of a portion of the PSDMMM of FIGS. 4A-5.
Figure 6B:
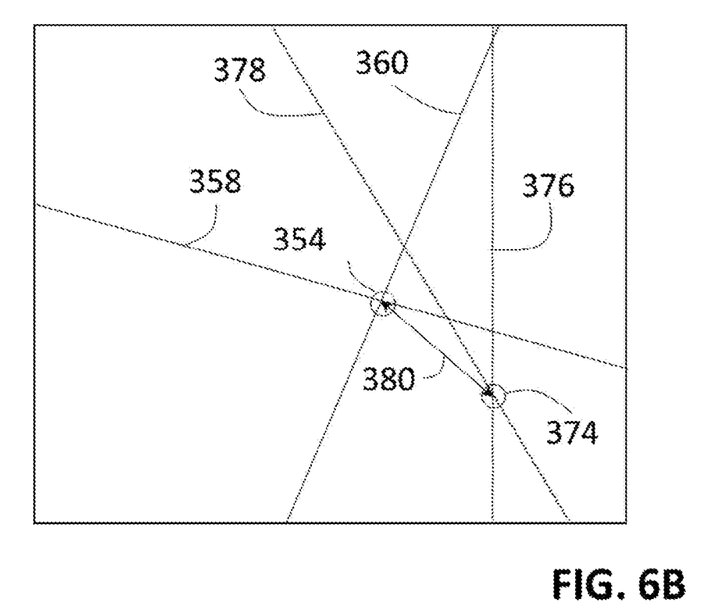

Reference is now made to FIGS. 6A & 6B, which are simplified pictorial illustrations of different embodiments of step 292 of PSDMMM 200.

As seen in FIG. 6A, when first layer 144 includes first periodic structure 142 and second periodic structure 148, and second layer 154 includes third periodic structure 152, at step 292, misregistration data analyzer 120 identifies a first reference location 314 at the intersection of the maxima or minima of clean first periodic structure data 224 generated at step 222, shown by reference number 318, and the maxima or minima of clean second periodic structure data generated at step 242, shown by reference number 320. Also at step 292, misregistration data analyzer 120 identifies a second reference location 334 whereat the maxima or minima of the clean third periodic structure data generated at step 262, shown by reference number 338, most closely intersect first reference location 314. Misregistration data analyzer 120 then calculates a distance 340 between first reference location 314 and second reference location 334, and reports distance 340 as the misregistration in one dimension between first layer 144 and second layer 154 of multilayered semiconductor device 102.

As seen in FIG. 6B, when first layer 144 includes first periodic structure 142 and second periodic structure 148, and second layer 154 includes third periodic structure 152 and fourth periodic structure 158, at step 292, misregistration data analyzer 120 identifies a first reference location 354 at the intersection of the maxima or minima of clean first periodic structure data 224 generated at step 222, shown by reference number 358, and the maxima or minima of clean second periodic structure data generated at step 242, shown by reference number 360. Also at step 292, misregistration data analyzer 120 identifies a second reference location 374 closest to first reference location 354 whereat the maxima or minima of the clean third periodic structure data generated at step 262, shown by reference number 376, and the maxima or minima of additional clean periodic structure data generated at step 282, shown by reference number 378, intersect. Misregistration data analyzer 120 then calculates a distance 380 between first reference location 354 and second reference location 374, and reports distance 380 as the misregistration in two dimensions between first layer 144 and second layer 154 of multilayered semiconductor device 102.

Similarly, when at least one of first and second layers 144 and 154 include at least three periodic structures, at step 292, misregistration data analyzer 120 identifies a first reference location at the intersection of the maxima or minima of all clean periodic structure data due to periodic structures on first layer 144 intersect. Also at step 292, misregistration data analyzer 120 identifies a second reference location closest to first reference location at the intersection of the maxima or minima of all clean periodic structure data due to periodic structures on second layer 154 intersect. Misregistration data analyzer 120 then calculates a distance between the first reference location and the second reference location, and reports the distance as the misregistration in two dimensions between first layer 144 and second layer 154 of multilayered semiconductor device 102.

In one embodiment of the present invention, PSDMMM 200, as described hereinabove with reference to FIGS. 4A-6B, is modified to measure misregistration between a third layer and at least one of first layer 144 and second layer 154 of multilayered semiconductor device 102. In such an embodiment, PSDMMM 200 generates a single image of at least one periodic structure formed with the third layer along with at least one of first periodic structure 142, second periodic structure 148 and third periodic structure 152, thereby providing an aggregate signal. PSDMMM 200 also extracts and cleans a component from the aggregate signal due to the periodic structure formed with the third layer, and the generated clean data corresponding to the periodic structure formed with the third layer and at least one of first periodic structure 142, second periodic structure 148 and third periodic structure 152 to ascertain misregistration between the third layer and at least one of first layer 144 and second layer 154.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A misregistration metrology method for measurement of misregistration in a manufacture of a multilayered semiconductor device, said multilayered semiconductor device including a first periodic structure having a first pitch along a first axis, said first periodic structure being formed together with a first layer of said multilayered semiconductor device, a second periodic structure having a second pitch along a second axis, said second axis not being parallel to said first axis, said second periodic structure being formed together with said first layer of said multilayered semiconductor device and a third periodic structure having a third pitch along a third axis, said third axis not being parallel to said first axis and said third axis not being parallel to said second axis, said third periodic structure being formed together with a second layer of said multilayered semiconductor device, said third periodic structure and said first and second periodic structures overlying one another;

said misregistration metrology method comprising:
generating a single image of said first periodic structure, said second periodic structure and said third periodic structure, thereby providing an aggregate signal;
extracting a first component from said aggregate signal, said first component being based on said first periodic structure;
extracting a second component from said aggregate signal, said second component being based on said second periodic structure;
extracting a third component from said aggregate signal, said third component being based on said third periodic structure; and
analyzing said first component, said second component and said third component, thereby to ascertain misregistration between said first layer and said second layer.

2. The misregistration metrology method according to claim 1, further comprising:
generating clean first periodic structure data;
generating clean second periodic structure data; and
generating clean third periodic structure data.

3. The misregistration metrology method according to claim 2, wherein said clean first periodic structure data is a function of:
said first component and said first pitch; or
said first component, said first pitch, and harmonics of said first pitch.

4. The misregistration metrology method according to claim 2, wherein said clean second periodic structure data is a function of:
said second component and said second pitch; or
said second component, said second pitch, and harmonics of said second pitch.

5. The misregistration metrology method according to claim 2, wherein said clean third periodic structure data is a function of:
said third component and said third pitch;
said third component, said third pitch, and harmonics of said third pitch.

6. The misregistration metrology method according to claim 2, wherein said analyzing said first component, said second component and said third component, thereby to ascertain misregistration between said first layer and said second layer comprises:

identifying a first reference location wherein at least one of maxima and minima of said clean first periodic structure data and said clean second periodic structure data intersect;
identifying a second reference location wherein at least one of maxima and minima of said clean third periodic structure data most closely intersects said first reference location; and
calculating a difference between said first reference location and said second reference location, thereby to ascertain misregistration between said first layer and said second layer.

7. The misregistration metrology method according to claim 2, wherein:
said second layer also comprises a fourth periodic structure having a fourth pitch along a fourth axis, said fourth axis not being parallel to said first axis, said second axis or said third axis;
a fourth component, being based on said fourth periodic structure, is extracted from said aggregate signal;
clean fourth periodic structure data is generated from said fourth component; and
said ascertaining of misregistration between said first layer and said second layer comprises:
identifying a first reference location wherein at least one of maxima and minima of said clean first periodic structure data and said clean second periodic structure data intersect;
identifying a second reference location, which most closely intersects said first reference location, wherein at least one of maxima and minima of said clean third periodic structure data and said clean fourth periodic structure data intersect; and
calculating a difference between said first reference location and said second reference location, thereby to ascertain misregistration between said first layer and said second layer.

8. The misregistration metrology method according to claim 1, wherein said first pitch, said second pitch and said third pitch are each between $1/1000$-$1/4$ of a length of a field of view of a wafer imaging tool.

9. The misregistration metrology method according to claim 1, wherein said first pitch, said second pitch and said third pitch are each between $1/500$-$1/20$ of a length of a field of view of a wafer imaging tool.

10. The misregistration metrology method according to claim 1, wherein said multilayered semiconductor device also comprises at least a third layer formed together with at least a third-layer periodic structure having a third-layer pitch along a third-layer axis, said third-layer axis not being parallel to said first axis, said third-layer axis not being parallel to said second axis and said third-layer axis not being parallel to said third axis and wherein said method comprises:
generating a single image of said third-layer periodic structure and said first and second periodic structures, thereby providing a second aggregate signal;
extracting a third-layer component from said second aggregate signal, said third-layer component being based on said third-layer periodic structure; and
analyzing said third-layer component, said first component and said second component, thereby to ascertain misregistration between said third layer and said first layer.

11. A misregistration metrology system for measurement of misregistration in a manufacture of a multilayered semiconductor device, said multilayered semiconductor device including a first periodic structure having a first pitch along a first axis, said first periodic structure being formed together with a first layer of said multilayered semiconductor device, a second periodic structure having a second pitch along a second axis, said second axis not being parallel to said first axis, said second periodic structure being formed together with said first layer of said multilayered semiconductor device and a third periodic structure having a third pitch along a third axis, said third axis not being parallel to said first axis and said third axis not being parallel to said second axis, said third periodic structure being formed together with a second layer of said multilayered semiconductor device, said third periodic structure and said first and second periodic structures overlying one another;

said misregistration metrology system comprising:
a wafer imaging tool operative to generate a single image of said first periodic structure, said second periodic structure and said third periodic structure, thereby providing an aggregate signal; and
a misregistration analyzer operative to:
extract a first component from said aggregate signal, said first component being based on said first periodic structure;
extract a second component from said aggregate signal, said second component being based on said second periodic structure;
extract a third component from said aggregate signal, said third component being based on said third periodic structure; and
analyze said first component, said second component and said third component, thereby to ascertain misregistration between said first layer and said second layer.

12. The misregistration metrology system according to claim 11, wherein said misregistration analyzer is further operative to:
generate clean first periodic structure data;
generate clean second periodic structure data; and
generate clean third periodic structure data.

13. The misregistration metrology system according to claim 12 and wherein said clean first periodic structure data is a function of:
said first component and said first pitch; or
said first component, said first pitch, and harmonics of said first pitch.

14. The misregistration metrology system according to claim 12, wherein said clean second periodic structure data is a function of:
said second component and said second pitch; or
said second component, said second pitch, and harmonics of said second pitch.

15. The misregistration metrology system according to claim 12, wherein said clean third periodic structure data is a function of:
said third component and said third pitch; or
said third component, said third pitch, and harmonics of said third pitch.

16. The misregistration metrology system according to claim 12, wherein said analyzing said first component, said second component and said third component, thereby to ascertain misregistration between said first layer and said second layer comprises:
identifying a first reference location wherein at least one of maxima and minima of said clean first periodic structure data and said clean second periodic structure data intersect;
identifying a second reference location wherein at least one of maxima and minima of said clean third periodic structure data most closely intersects said first reference location; and
calculating a difference between said first reference location and said second reference location, thereby to ascertain misregistration between said first layer and said second layer.

17. The misregistration metrology system according to claim 12, wherein:
said second layer also comprises a fourth periodic structure having a fourth pitch along a fourth axis, said fourth axis not being parallel to said first axis, said second axis or said third axis;
a fourth component, being based on said fourth periodic structure, is extracted from said aggregate signal;
clean fourth periodic structure data is generated from said fourth component; and
said ascertaining of misregistration between said first layer and said second layer comprises:
identifying a first reference location wherein at least one of maxima and minima of said clean first periodic structure data and said clean second periodic structure data intersect;
identifying a second reference location, which most closely intersects said first reference location, wherein at least one of maxima and minima of said clean third periodic structure data and said clean fourth periodic structure data intersect; and
calculating a difference between said first reference location and said second reference location, thereby to ascertain misregistration between said first layer and said second layer.

18. The misregistration metrology system according to claim 11, wherein said first pitch, said second pitch and said third pitch are each between $1/1000$-$1/4$ of a length of a field of view of said wafer imaging tool.

19. The misregistration metrology system according to claim 11, wherein said first pitch, said second pitch and said third pitch are each between $1/500$-$1/20$ of a length of a field of view of said wafer imaging tool.

20. The misregistration metrology system according to claim 11, wherein said multilayered semiconductor device also comprises at least a third layer formed together with at least a third-layer periodic structure having a third-layer pitch along a third-layer axis, said third-layer axis not being parallel to said first axis, said third-layer axis not being parallel to said second axis and said third-layer axis not being parallel to said third axis and wherein said wafer imaging tool is further operative to:
generate a single image of said third-layer periodic structure and said first and second periodic structures, thereby providing a second aggregate signal; and
wherein said misregistration analyzer is further operative to:
extract a third-layer component from said second aggregate signal, said third-layer component being based on said third-layer periodic structure; and
analyze said third-layer component, said first component and said second component, thereby to ascertain misregistration between said third layer and said first layer.

* * * * *